United States Patent [19]

Camiade et al.

[11] Patent Number: 5,280,633
[45] Date of Patent: Jan. 18, 1994

[54] ACTIVE ANTENNA FOR TWO-WAY TRANSMISSION

[75] Inventors: Marc Camiade, Antony; Véronique Serru, Paris; Dominique Geffroy, Courcouronnes, all of France

[73] Assignee: Thomson Composants Microondes, Puteaux, France

[21] Appl. No.: 669,580

[22] Filed: Mar. 14, 1991

[30] Foreign Application Priority Data

Mar. 27, 1990 [FR] France ................. 90 03879

[51] Int. Cl.⁵ .............................................. H04B 1/46
[52] U.S. Cl. .......................................... 455/79; 455/84; 340/505; 307/570; 343/876
[58] Field of Search .............. 455/78, 82, 83, 280, 455/282, 291, 293, 79, 84; 343/701, 876; 307/570; 375/8, 7, 68; 340/505

[56] References Cited

U.S. PATENT DOCUMENTS

| | | | |
|---|---|---|---|
| 4,104,630 | 8/1978 | Chasek | 342/44 |
| 4,504,796 | 3/1985 | Igarashi | 330/286 |
| 4,591,803 | 5/1986 | Saleh | 330/277 |

FOREIGN PATENT DOCUMENTS

| | | |
|---|---|---|
| 0023275 | 6/1980 | European Pat. Off. . |
| 0343034 | 5/1989 | European Pat. Off. . |
| 0237319 | 9/1990 | Japan ......................... 455/78 |
| 2161046 | 1/1988 | United Kingdom ........... 455/78 |

OTHER PUBLICATIONS

Radio Electronics, pp. 58–60 Mar. 1978.

*Primary Examiner*—Jin F. Ng
*Assistant Examiner*—Andrew Faile
*Attorney, Agent, or Firm*—Oblon, Spivak, McClelland, Maier & Neustadt

[57] ABSTRACT

This active antenna is incorporated in the terminal station of a system for data exchange with a central station, by the modulation of a microwave carrier. The terminal station is of the chip card type. The modem of the active antenna is constituted by a transistor, the bias current of which is switched over from a low value at demodulation to a high value at modulation. The switch-over is obtained by a circuit with three resistors ($R_d$, $R_{gd}$, $R_g$), which themselves have their values switched over by two transistors parallel connected with the resistors, these transistors being controlled by two signals emitted by the control circuit of the terminal station. The active antenna can be applied to long-distance data exchange, for example in the remote management of toll-charge systems, remote cash dispensing, localization of moving bodies etc.

7 Claims, 2 Drawing Sheets

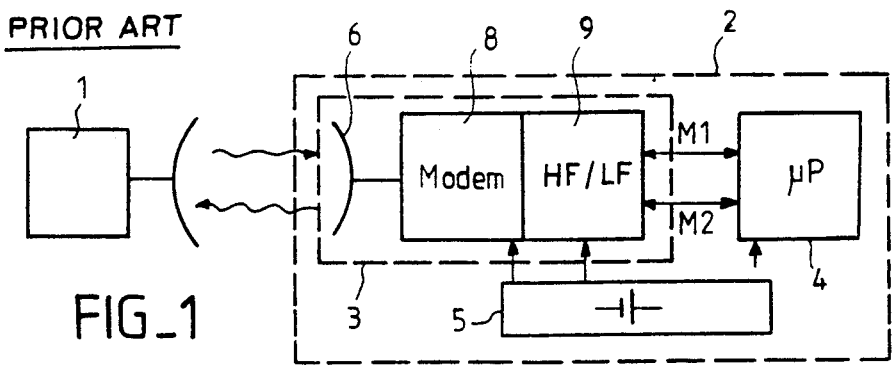
FIG_1
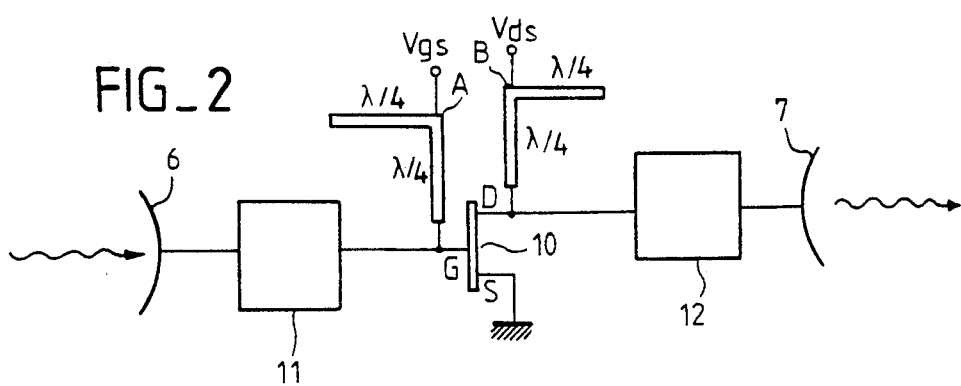
FIG_2
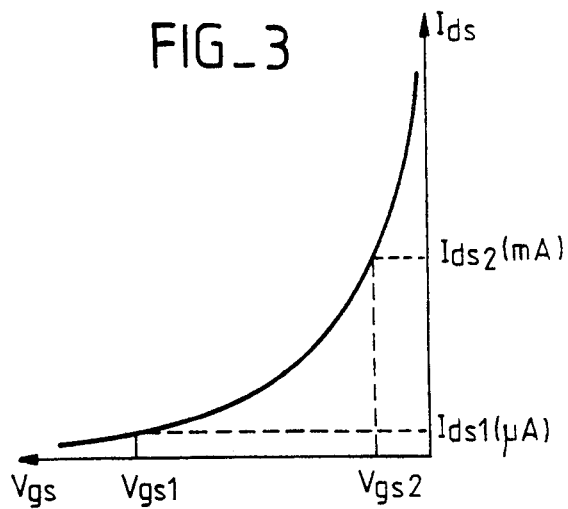
FIG_3
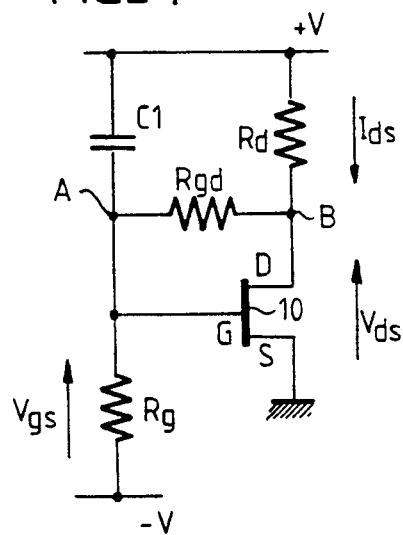
FIG_4

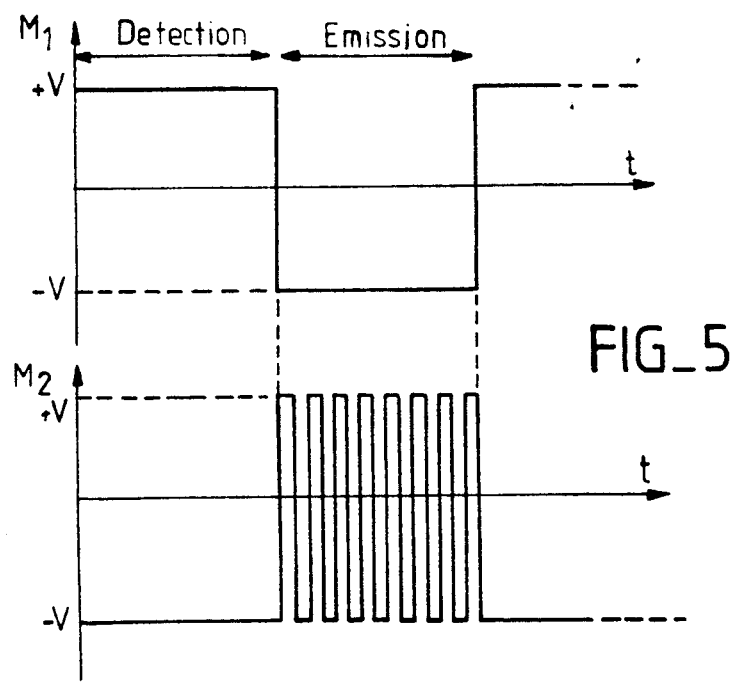
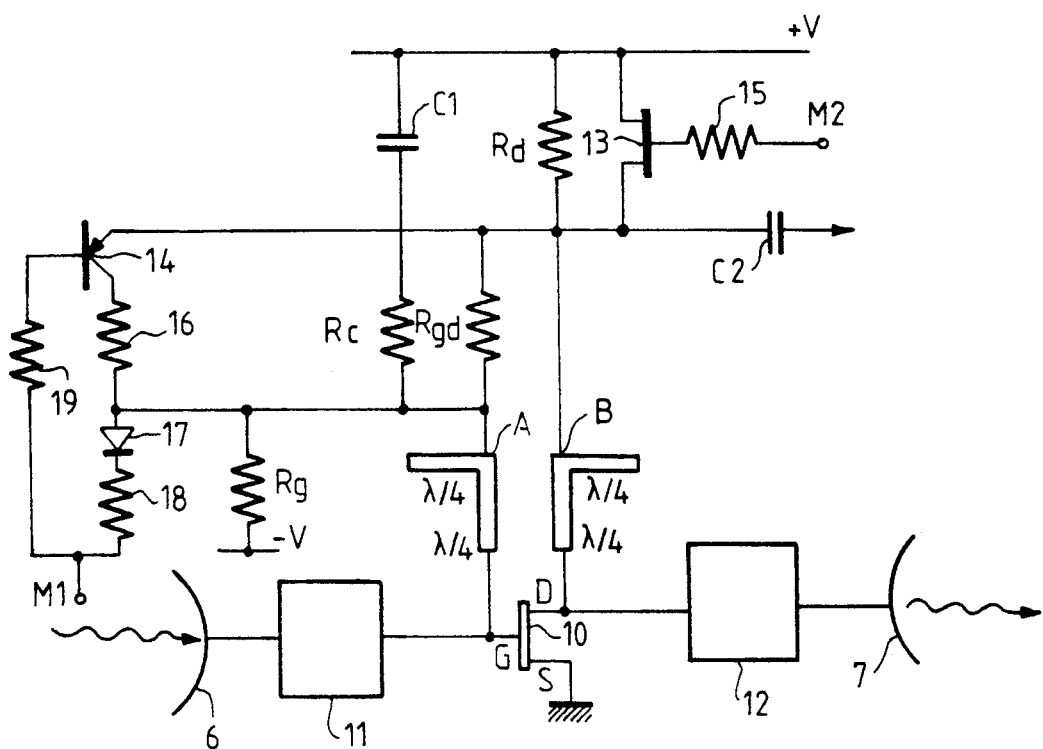

ACTIVE ANTENNA FOR TWO-WAY TRANSMISSION

BACKGROUND OF THE INVENTION

1. Field of the Invention

The present invention concerns a two-way microwave communications circuit between a central station or fixed beacon, fitted out with a signal transmission and reception system, and a terminal station or independently powered mobile device. More precisely, the invention relates to a circuit known as an "active antenna" which, in the portable badge type mobile device, maintains a watch for interrogation signals and, having detected them, activates the device so that, in turn, this mobile device transmits encoded signals with greater power in response to the interrogation.

2. Description of the Prior Art

This type of data exchange can be applied, for example, to the remote management of toll-charges, remote cash dispensing or to the identification or localization of moving bodies. The mobile device takes the form of a chip card, carried by a person, or the form of a moving object. Supplied by small "button" batteries, it has to be extremely economical in its use of power.

The block diagram of this type of data exchange is known per se and is recalled in FIG. 1. A beacon 1 exchanges microwave signals with a portable badge 2 that includes an active antenna 3 and control circuits 4, these elements 3 and 4 being supplied with energy by a supply 5, essentially formed by one or more batteries.

The active antenna 3 itself comprises:
one or two transmission/reception antenna 6-7;
a microwave modem circuit 8 to modulate and demodulate the information transmitted in the form of logic pulses;
a low frequency/microwave interface circuit 9, to enable the link with the control circuits 4 which include, for example, a microprocessor and memories.

The modulation used in this application is of the OOK type, i.e. it is an all or nothing type amplitude modulation of the microwave carrier. In an interrogation mode, the beacon sends out a modulated wave in pulses of varying lengths. In reception mode, the beacon sends out a pure wave and the portable badge sends out a modulated wave.

As a consequence, the badge should be capable of working in two states:
in reception, under very low energy consumption (some microamperes) for this is its almost permanent state, it should be capable of receiving and demodulating an interrogation signal sent out by the fixed beacon;
in transmission, after having identified an interrogator, it should be capable of sending out a signal having a specific modulation with sufficient . power (some milliamperes).

It is therefore necessary to switch over the portable badge, to make it go from one state to another state, in the simplest possible way so that consumption in the watching state is very low.

SUMMARY OF THE INVENTION

According to the invention, the functions of detection and transmission, as well as the functions of the switch-over element, are fulfilled by a single semiconductor device which is either a field-effect transistor or an amplifier with field-effect transistors. By the shifting of the bias point of this transistor, said transistor works either as an excellent detector of a microwave or as an amplifier. The shifting of the bias point is itself obtained by switching over between two sets of resistors controlled by signals coming from control circuits 4.

More specifically, the invention relates to an active antenna for the two-way transmission of information, by the modulation/demodulation of a microwave carrier, between a central station that sends out first modulated interrogation signals and a terminal station that responds to it by second modulated signals, the terminal station including active antenna, wherein its modulation/demodulaion means or modem is constituted by a transistor, the bias current ($I_{ds}$) of which is switched over between a value that is low at reception, the transistor being in the detector/demodulator state, and a value that is high at transmission, the transistor being in the amplifier/modulator state.

BRIEF DESCRIPTION OF THE DRAWINGS

The following invention will be understood more clearly from an exemplary application, described with reference to the appended figures, of which:

FIG. 1 shows a block diagram of a data hereabove;

FIG. 2 shows an assembly diagram of a transistor as a detector/amplifier according to the invention;

FIG. 3 shows the characteristic curve $I_{ds}=f(V_{gs})$, as used in the assembly according to the invention;

FIG. 4 shows a bias network of a transistor, according to the invention;

FIG. 5 is a timing diagram of the switch-over signals;

FIG. 6 is an electrical diagram of the active antenna according to the diagram.

DETAILED DESCRIPTION OF THE INVENTION

To make the explanations clearer, the invention shall be explained by choosing a field-effect transistor as the active component. This does not limit the scope of the invention: an MMIC (microwave monolithic integrated circuit) type amplifier also has a field-effect transistor as the input stage.

In the current state of the art, and taking account of the frequencies used (1 to 100 GHz), this transistor is preferably made of GaAs or III-V type materials, such as GaAlAs, InP etc. However, the invention also covers the use of transistors made of silicon when they are pushed to their extreme frequencies which are of the order of some gigahertz.

The microwave part 8, or modulator-demodulator of FIG. 1, uses a field-effect transistor coupled to two antennas, as shown in FIG. 2.

The input signal, coming from the fixed bacon 1, is received by the detection antenna 6: it is applied to the gate of the transistor 10 through a first impedance matching network 11. This network 11, formed by microstrip elements with a length $\lambda g</4$ ($\lambda g$=guided wavelength) results from a compromise, between the matching of the gate impedance of the transistor in the "reception" state and the gate impedance of the transistor in the "transmission" state with respect to the antenna 6, which is a printed antenna.

The source of the transistor 10 is grounded.

A second impedance matching network 12 is mounted on the drain between the transistor 10 and the transmission antenna 7. This second matching network 12 is constituted, like the first network 11, by matched line elements. In the "reception" state, it enables the extraction of the demodulated signal, which is addressed in low frequency to the control circuit 4 by a demodulated output not shown in this figure. In the transmission state, it also enables the impedance matching of the drain with respect to the antenna 7, which is also printed.

The two antennas 6 and 7 are constituted by slots in the ground plane of the dielectric substrate that supports the transistor 10 and the line elements. on the transistor side face, two line elements intersect the two demetallized slots of the other face at right angles.

The bias voltages $V_{gs}$ and $V_{ds}$ are applied to the gate and the drain of the transistor 10 through a network of lines with lengths $\lambda g/4$. Let A and B be the points at which the voltages $V_{gs}$ and $V_{ds}$, respectively, are applied.

According to the invention, the transistor 10 is forced to work under two biases: depending on its point of bias, a field-effect transistor constitutes an excellent power detector or an amplifier. FIG. 3 gives the characteristic $I_{ds}=f(V_{gs})$ of the drain current as a function of the gate voltage.

In reception, the transistor 10 works at a very low drain current ($I_{ds1}$=some $\mu A$), and it behaves like a detector for it works on the bend of the characteristic curve $I_{ds}(V_{gs})$, in the region where it is not linear around the pinch-off voltage. The detection sensitivity thus obtained is generally greater than that which could have been obtained with Schottky diodes. Under these working conditions, the transistor 10 constitutes the demodulator of the active antenna, and it transmits the interrogation signals sent out by the fixed beacon.

In transmission, the bias point of the transistor 10 is shifted so as to obtain a current $I_{ds2}$ of some milliamperes. The switch-over means will be explained further below. The transistor then behaves like an amplifier: it will be enough to modulate the gate bias voltage $V_{gs}$ or drain bias voltage $V_{ds}$ of this amplifier to generate an amplitude modulation. The transistor 10 forms a modulator. Furthermore, there is a re-transmission gain and, consequently, an increase in the range of the badge.

The switch-over from one state to the other is achieved by a switch-over of resistors, under the effect of commands M1 and M2 which are pulses transmitted by the control circuit 4. However, before explaining the means implemented to obtain the switching over of the badge, we must explain the negative feedback circuit that has been developed and perfected to avoid the operation of sorting the components during the manufacture of the badge.

Indeed, this microwave badge is a mass consumption type of product, manufactured in large quantities. It is therefore indispensable to eliminate all the adjustments therein, related to the dispersion or variations in the characteristics of the components. At present, it is the static characteristics of the microwave transistor that are the most liable to variations. To avoid subjecting this component to excessively strict sorting conditions which would increase its cost, a negative feedback circuit shown in FIG. 4 has been developed and perfected. It is aimed at correcting the voltage $V_{gs}$ as a function of the bias current $I_{ds}$, and hence of the bias voltage $V_{ds}$, of the transistor.

This very simple circuit has:

a drain resistor $R_d$, connected between the drain and the source of positive bias $+V$, a gate resistor $R_g$, connected between the gate and the source of negative bias $-V$, a gate-drain resistor $R_{gd}$, mounted as a bridge between the gate and the drain, the three resistors $R_g$, $R_{gd}$ and $R_d$ being in series:

We have:

$$|V_{gs}| = \frac{R_g}{R_g + R_{gd}}(2V - R_d I_{ds})$$

with $R_g$ and $R_{gd} > R_d$.

When $I_{ds}$ increases, $V_{gs}$ diminishes and leads to a reduction in $I_{ds}$. And the reverse takes place if $I_{ds}$ diminishes. Thus a relationship has been established between the bias current $I_{ds}$ and the gate voltage $V_{gs}$ that enables the use of transistors having far greater variations in static characteristics than would be the case without negative feedback. This negative feedback circuit enables an increase, by a factor of more than 10, in the acceptable variations in the voltage $\Delta V_{gs}$, for a same current $I_{ds}$, as compared with an assembly without negative feedback.

For the same reasons, this circuit gives greater control over the bias point as a function of the voltage of the batteries which give $+V$ and $-V$.

This automatic control circuit works in two states of bias of the transistor.

In reception, when the transistor works as a demodulator with a very low current $I_{ds}$ bias, the resistors $R_g$ and $R_{gd}$ have very high values ($\sim 10$ M$\Omega$) so as not to lose any energy in the divider bridge $R_g - R_{gd}$, and the drain resistor $R_d$ has a value of the order of 100 k$\Omega$. It is also necessary to add a capacitor $C_1$ between the supply voltage $+V$ and the gate of the transistor, so as to cancel out the effect of the negative feedback at the demodulation frequency. For, this would greatly attenuate the detection current since its aim is to regulate the current $I_{ds}$.

In transmission, when the transistor works as a modulator/amplifier, with a current $I_{ds}$ of some milliamperes, the drain resistor $R_d$ has to be switched over to a value of the order of 0.1 k$\Omega$, to provide for the gain, and the resistors $R_g$ and $R_{gd}$ have to be switched over to the lowest values ($\sim 10$ k$\Omega$) so as to eliminate all the effects related to the time constants.

The resistors are switched over by means of two transistors, according to the diagram of FIG. 6, and under the action of two control signals M1 and M2 which act according to the graph of FIG. 5.

M1 and M2 are sent out by the control circuits 4. The signal M1 that controls the changing of the bias point of the transistor is equal to $+V$ so long as the badge is in the detection state (i.e. most of the time) and it is equal to $-V$ when signals are being transmitted by the badge. So long as M1 is at $+V$, the signal M2 is at $-V$ and, during the transmission time, M2 is a signal with square wave pulses between $+V$ and $-V$, at a frequency of the order of 100 KHz to 1 MHz.

In FIG. 6, it is seen that the signal M1 is applied to the base of a bipolar PNP transistor 14, through a resistor 19. The emitter of this transistor 14 is connected to the common point between $R_d$ and $R_{gd}$, and the collector is connected through a resistor 16 to the common point between $R_{gd}$ and $R_g$. From this common point onwards, a diode 17 and a resistor 18 get looped back to the input terminal of the signal M1.

Besides, the signal M2 is applied through a resistor 15 (~100 kΩ), to the gate of a field-effect transistor 13 mounted in a bypass connection on the resistor $R_d$. At the common point between $R_d$ and $R_{gd}$, an output sends the demodulated signals to the control circuit 4, during the interrogation of the badge by the fixed beacon.

When the signal M1 is at $-V$, the diode 17 and the transistor 14 are conductive: the bias point of the transistor 10 is fixed by the resistors 16 and 18, as well as by the fixed values of the saturation voltages of the diode 17 and of the transistor 14. Indeed, the resistors 16 and 18 have low values (~10 kΩ) compared with those of $R_{gd}$ and $R_g$ (~10 MΩ) and these two divider bridges are parallel connected. In this state, the transistor 10 works as an amplifier: the modulation of the transmitted signals is dictated to it by the signal M2, at its drain.

During the detection (M1 = +V), the signal M2 is at $-V$, the transistor 13 is off, and the resistors $R_g$ and $R_{gd}$ (~10 MΩ) dictate a low current $I_{ds}$.

During the transmission (M1 = $-V$), the signal M2 is modulated between $+V$ and $-V$. When M2 = $+V$, the transistor 13 is turned on and the resistor $R_d$ (~100 kΩ) is shunted by the equivalent drain-source resistor of the transistor 13 (~0.1 kΩ), which regulates the current $I_{ds}$ of the transistor 10 by negative feedback. When M2 = $-V$, the value of the resistor $R_d$ is high because the transistor 13 is off. The voltage $V_{ds}$ of the transistor 10 is below 0V and shows high losses at the microwave frequencies. Thus, the signal M2 has been used to achieve an amplitude modulation of the drain signal, sent out by the antenna 7 through the matching network 12.

We have introduced a resistor $R_c$, with a value in the range of 100 kΩ, in series with $C_1$, for the following reasons.

in reception, it has no effect since its value is far below that of $R_{gd}$ and $R_g$, and the capacitor $C_1$ truly plays its role;

in transmission, it cancels out the effect of the capacitor $C_1$ since $R_C$, is far greater than $R_{16}$ and $R_{18}$. Indeed, given the demodulation frequencies of the microwave signal which can go up to 1 MHz, it is necessary to get rid of the time constant, in transmission, induced by $C_1$.

If we consider the transistors 13 and 14 to be only switch-over means, it is seen that the active antenna 3 of the portable badge has only one transistor 10 which, depending on the bias point imposed on it by the negative feedback circuit, works as a detector/demodulator or as an emitter/modulator.

The invention has been explained on the basis of the example of a field-effect transistor 10: it is clear that this field-effect transistor may be made either of fast materials of the GaAs, GaAlAs type, or of silicon semiconductors. The single transistor 10 may also be only the input stage of an integrated circuit amplifier including several stages.

In the same way, to give a clear picture, it has been stated that the beacon is fixed and the microwave badge is mobile. The invention would remain valid if a beacon forming an interrogation system filed past fixed badges since the invention relates to a system of data exchange by microwaves between an interrogator device and a responder device.

What is claimed is:

1. An active antenna for the two-way transmission of information, by the modulation/demodulation of a microwave carrier, between a central station that sends out first modulated interrogation signals and a terminal station that responds to said central station by second modulated signals, the terminal station including said active antenna, wherein a modulation/demodulation means or modem of said antenna includes a transistor to which a bias current ($I_{ds}$) is applied, said bias current being switched over between a value that is low at reception, with the transistor being in the detector/demodulator state, and a value that is high at transmission, with the transistor being in the amplifier/modulator state.

wherein the circuit for switching over the bias current of the transistor is constituted by three resistors ($R_d$, $R_{gd}$, $R_g$) with high values, series-connected between the two poles (+V, −V) of a voltage supply, the second resistor ($R_{gd}$) of this series being connected between the gate and the drain of the transistor, wherein the source of the transistor is grounded, said three resistors ($R_d$, $R_{gd}$, $R_g$) being switched over from a high value in the demodulation state to a low value in the modulation state by means of a pair of transistors controlled by two switch-over signals that alternately take the positive (+V) and negative (−V) values of the supply.

2. An active antenna according to claim 1, wherein:
the pair of transistors comprise a field effect transistor and a bi-polar transistor
the first resistor ($R_d$) is parallel-connected with the field-effect transistor, the gate of which is controlled by a second control signal (M2), corresponding to one of said switch-over signals, coming from a control circuit of the terminal station,
a first divider bridge, formed by the second resistor ($R_{gd}$) and by the third resistor ($R_g$) is parallel-connected with a second divider bridge formed by a fourth resistor with a low value, the common point of the second and third resistors ($R_{gd}$, $R_g$) being connected to the common point of the fourth resistor and a diode, the switch-over between the first and second divider bridges being achieved by the bipolar transistor, the base of which is controlled by a first control signal (M1), corresponding to the other of said two switch-over signals, coming from the control circuit, the first signal being furthermore applied to a fifth resistor of the second divider bridge.

3. An active antenna according to claim 3 wherein, in the demodulation state, the first control signal, is equal to the negative voltage (−V) and the second control signal is modulated between the positive voltage (+V) and the negative voltage (−V) of the supply.

4. An active antenna according to claim 1, wherein a capacitor is mounted between the gate of the transistor and the positive voltage (+V) of the supply, with a value such that its time constant is greater than the period of modulation of the first interrogation signal.

5. An active antenna according to claim 1, wherein a demodulated output is picked up at the drain of the transistor and addressed to a control circuit of the terminal station.

6. An active antenna according to claim 1, wherein the transistor is the input stage of an integrated circuit amplifier.

7. An active antenna according to claim 1, wherein said antenna works in the microwave range of 1 to 100 GHz.

* * * * *